United States Patent
Zhu et al.

(10) Patent No.: US 9,143,112 B2
(45) Date of Patent: Sep. 22, 2015

(54) CIRCUITS AND METHODS FOR PROVIDING AN IMPEDANCE ADJUSTMENT

(75) Inventors: Xiqun Zhu, Austin, TX (US); Don Alfano, Round Rock, TX (US)

(73) Assignee: Silicon Laboratories Inc., Austin, TX (US)

( * ) Notice: Subject to any disclaimer, the term of this patent is extended or adjusted under 35 U.S.C. 154(b) by 1030 days.

(21) Appl. No.: 13/174,382

(22) Filed: Jun. 30, 2011

(65) Prior Publication Data

US 2013/0002368 A1     Jan. 3, 2013

(51) Int. Cl.
    *G05F 1/10*          (2006.01)
    *H03H 7/40*        (2006.01)
    *H04B 3/54*        (2006.01)

(52) U.S. Cl.
CPC .. *H03H 7/40* (2013.01); *H04B 3/54* (2013.01); *H04B 2203/547* (2013.01); *Y02E 10/56* (2013.01)

(58) Field of Classification Search
CPC ............ H03H 7/38; H03H 7/40; Y02E 10/56; H04B 3/54; H04B 2203/547
USPC .......................................................... 307/98
See application file for complete search history.

(56) References Cited

U.S. PATENT DOCUMENTS

| | | |
|---|---|---|
| 1,547,242 A | 7/1925 | Strieby |
| 4,457,014 A | 6/1984 | Bloy |
| 4,468,792 A | 8/1984 | Baker et al. |
| 4,471,399 A | 9/1984 | Udren |
| 4,745,391 A | 5/1988 | Gajjar |
| 5,402,073 A | 3/1995 | Ross |
| 5,465,287 A | 11/1995 | Egozi |
| 5,631,569 A | 5/1997 | Moore et al. |
| 6,397,156 B1 | 5/2002 | Bachmann et al. |
| 6,515,485 B1 | 2/2003 | Bullock et al. |
| 6,713,998 B2 | 3/2004 | Stanimirov |
| 6,933,835 B2 | 8/2005 | Kline |
| 6,950,567 B2 | 9/2005 | Kline |
| 6,958,680 B2 | 10/2005 | Kline |
| 7,075,414 B2 | 7/2006 | Giannini |
| 7,426,645 B2 | 9/2008 | Leung et al. |
| 7,526,392 B2 | 4/2009 | Gasperi et al. |
| 7,616,010 B2 | 11/2009 | Gasperi |
| 2008/0238195 A1* | 10/2008 | Shaver et al. ................... 307/18 |
| 2010/0127570 A1* | 5/2010 | Hadar et al. .................... 307/77 |
| 2011/0109346 A1* | 5/2011 | Moussaoui et al. ............. 327/60 |
| 2011/0221416 A1* | 9/2011 | Ivanov et al. .................. 323/285 |
| 2012/0033466 A1* | 2/2012 | Moussaoui ....................... 363/65 |
| 2012/0152300 A1* | 6/2012 | Zuckerman et al. .......... 136/244 |

* cited by examiner

*Primary Examiner* — Daniel Cavallari
(74) *Attorney, Agent, or Firm* — Cesari & Reed LLP; R. Michael Reed

(57) ABSTRACT

An apparatus includes a signal generator and a control circuit. The signal generator includes a control terminal and includes a current electrode coupled to a terminal that is configured to couple to a power line to receive direct current (DC) power from a power generator. The control circuit is coupled to the current electrode and the control terminal of the signal generator. The control circuit determines an impedance associated with the power generator and applies a control signal to the control terminal of the signal generator to produce an impedance adjustment signal on the current electrode for communication to the power generator through the power line in response determining the impedance.

15 Claims, 4 Drawing Sheets

US 9,143,112 B2

CIRCUITS AND METHODS FOR PROVIDING AN IMPEDANCE ADJUSTMENT

FIELD

The present disclosure is generally related to power generation systems, and more particularly to systems for remote detection and adjustment of impedances within a power generation system.

BACKGROUND

Power generators convert mechanical energy or solar energy into direct current (DC) power, which can be transmitted through a power line to a power inverter that converts the DC power into an alternating current (AC) power. Efficient power transmission between each power generator and the power inverter requires impedance matching. Unfortunately, the performance of a particular power generator may vary during operation. For example, clouds may cast shadows on solar panels, causing a significant drop off in power generation from the particular solar panel. In another example, wind speeds may vary, causing the power production of a particular wind turbine to vary. With such variations, the internal impedance of the environmental transducer may also vary.

SUMMARY

In an embodiment, apparatus includes a signal generator and a control circuit. The signal generator includes a control terminal and includes a current electrode coupled to a terminal that is configured to couple to a power line to receive direct current (DC) power from a power generator. The control circuit is coupled to the current electrode and the control terminal of the signal generator. The control circuit determines an impedance associated with the power generator and applies a control signal to the control terminal of the signal generator to produce an impedance adjustment signal on the current electrode for communication to the power generator through the power line in response determining the impedance.

In another embodiment, a circuit for use in power control systems includes a plurality of inputs configured to couple to a respective plurality of power generators through associated power lines and includes a plurality of signal generators. Each of the plurality of signal generators has a control terminal and has a current electrode coupled to a respective one of the plurality of inputs. The circuit further includes a plurality of detectors and a controller. Each of the plurality of detectors includes an input coupled to one of the plurality of inputs and an output. The controller is coupled to the output of each of the plurality of detectors and to the control terminal of each of the plurality of signal generators. The controller receives a signal from one of the plurality of detectors indicating an electrical parameter associated with a selected one of the plurality of inputs. The controller selectively controls one of the plurality signal generators coupled to the selected one of the plurality of inputs to communicate an impedance adjustment signal to a power generator of the respective plurality of power generators coupled to the selected one of the plurality of inputs.

In still another embodiment, a method includes controlling a signal source during a first mode to selectively apply a signal to an input terminal configurable to couple to a power line for receiving a power supply and measuring an electrical parameter of the input terminal during the first mode. The method further includes determining an impedance associated with the power line in response to measuring the electrical parameter and controlling the signal source during a second mode to provide an impedance adjustment signal to the input terminal for communication to a remote device through the power line.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

Embodiments of systems, circuits, and methods are described below that can be used to manage impedance matching between remote devices (such as environmental power generators) and a central power inverter. In particular, a central inverter includes a controller that uses a switched impedance or another signal source to apply a signal to an input terminal configurable to couple to a power line for receiving a power from a remote device. The controller receives one or more measurements associated with an electrical parameter of the input terminal before and after application of the signal. The controller infers an impedance associated with the power line in response to the one or more measurements. Further, the controller is configured to control the switched impedance or other signal source to apply a time-varying signal to the input terminal to provide an impedance adjustment signal to the remote device through the power line. Thus, the same circuit and the same power line can be used to receive power and to communicate impedance information to the remote device, which impedance information can be used to provide impedance matching to enhance the efficiency of the power delivery.

Figure 1:
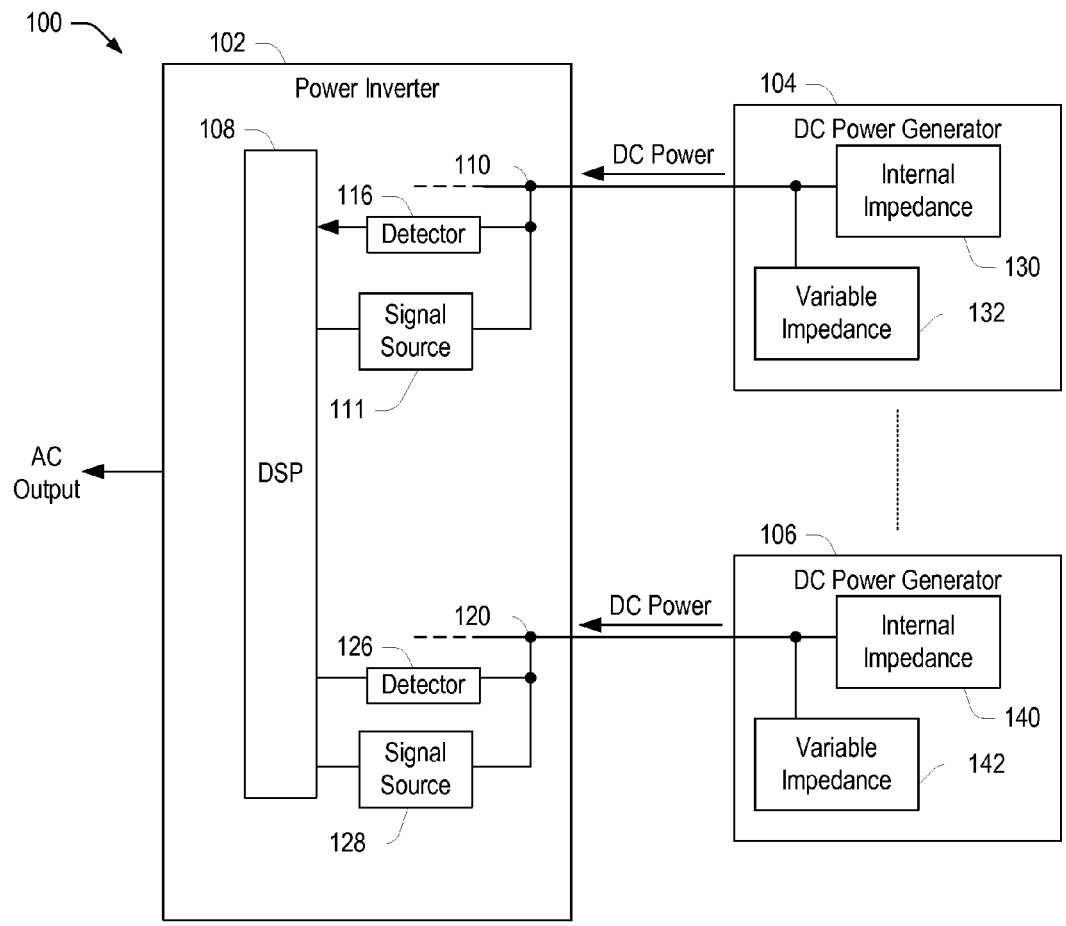
FIG. 1 is a partial block and partial circuit diagram of an embodiment of a system including a power inverter having a control circuit for controlling an impedance adjustment in a remote power generator.

FIG. 1 is a block diagram of an embodiment of a system 100 including a power inverter 102 having a controller 108 for controlling an impedance adjustment in a remote power generator. Power inverter 102 is coupled to a plurality of power generators, such as environmental power generators 104 and 106. In an example, environmental power generators 104 and 106 can be environmental transducers configured to convert energy from an environmental energy source (such as the sun, wind, water, etc.) into electricity. Such environmental transducers can include solar panels, wind turbines, water turbines, or other transducers to convert kinetic energy from the environment into electricity. Environmental power generators 104 and 106 produce electricity from the kinetic energy of the environment and provide the electricity to power inverter 102.

Environmental power generator 104 includes an internal impedance 130, which is coupled to input node 110 and which may vary according to environmental conditions. Environmental power generator 104 further includes a variable impedance 132, which is coupled to input node 110 and which can be controlled to adjust the impedance of Environmental power generator 104.

Power inverter 102 includes a first input node 110 coupled to Environmental power generator 104 and a second input node 120 coupled to Environmental power generator 106. Power inverter 102 further includes a controller 108 (such as a processor), which controls operation of the power inverter 102. Further, power inverter 102 includes a detector 116 including an input coupled to input node 110 and an output coupled to controller 108. Controller 108 includes an output coupled to an input of a signal source 111, which has an output coupled to input node 110. Power inverter 102 also includes a detector 126 including an input coupled to input node 120 and an output coupled to controller 108. A signal source 128 includes an input coupled to an output of controller 108 and an output coupled to input node 120.

Environmental power generators can exhibit variability in terms of their power output as well as variability in their internal impedance, which may result in efficiency reduction due to impedance mismatches between the environmental power generator, the DC power line, and the power inverter on the other end of the DC power line. In an example, due to inherent performance inconsistency among solar panels caused by non-uniformity of solar cells and their varying rates of degradation, variable shading from buildings, trees or shifting clouds, and the like each solar panel's impedance may vary over time. Similarly, for wind turbines, inherent performance inconsistency among wind turbines and variability in wind speeds and direction can produce impedance variations. Some variations (such as degradation or non-uniformity) may vary from unit to unit but may remain relatively constant over time. In contrast, some variations, such as those due to rapidly changing factors (such as the weather) may result significant losses in efficiency unless the impedance can be adjusted. In some instances, it may be desirable to adjust the impedance dynamically, periodically, such as every a few seconds, to reflect the varying conditions and performances of the one or more DC power generators.

In a particular embodiment, any number of environmental power generators can be deployed in a power generation system, such as a solar farm. Each environmental power generator 104, 106 and others (not shown) converts kinetic energy into electricity and outputs DC power to a central inverter, such as power inverter 102, which collects the DC power from the various environmental power generators, converts the DC power into AC power synchronized to the power grid, and outputs the AC power to a utility power line.

As mentioned above, the internal impedances 130 and 140 of environmental power generators 104 and 106 can vary due to variable environmental conditions. Each of the environmental power generators 104 and 106 includes a variable impedance 132, 142, etc., which can be dynamically and individually adjusted by controller 108 to substantially match the impedances to enhance the overall energy flow from environmental power generators 104 and 106 into power inverter 102.

In an example, controller 108 uses detectors 116 and 126 to measure an electrical parameter (such as a voltage level, a current level, a complex impedance, etc.) before and after applying a signal to output input node 110 and/or 120. In an example, controller 108 measures the electrical parameter, and then controls signal source 111 to selectively apply a signal to input node 110 and measures the electrical parameter again. In a particular example, signal source 111 applies a relatively low voltage to input node 110. In a particular example, signal source 111 can include a transistor having its drain coupled to input node 110, its source coupled to a first terminal of a resistor that has a second terminal coupled to a power supply terminal (e.g., ground), and a control terminal coupled to controller 108. In this instance, controller 108 activates the transistor to provide a current flow path from input node 110 to ground across the resistor. By controlling the transistor to allow current flow through the resistor to ground, controller 108 controls the signal source 111 to apply a signal to input node 110 or to alter the impedance at input node 110.

In response to the signal or impedance applied to input node 110, detector 116 detects an electrical parameter associated with input node 110. The electrical parameter can include a current level, a voltage level, a time-varying signal (such as an exponentially decaying signal), or another electrical parameter. Detector 116 provides a signal related to the detected electrical parameter to controller 108 each time a measurement is captured. In an example, detector 116 can include an analog-to-digital converter (ADC) and/or a resistor for sampling an analog current or voltage level at input node 110 and to provide digital outputs to controller 108 that represent the electrical parameter. Detector 116 can be activated periodically or can be continuously active for sampling the electrical parameter at input node 110.

In response to receiving one or more samples, controller 108 determines an impedance associated with environmental power generator 104. The impedance may be inferred from samples captured by detector 116 before and after application of a signal by signal source 111. In one example, the samples can be used to determine an impedance associated with the environmental power generator 104. In response to determining the impedance, controller 108 selectively controls signal source 111 to provide one or more signal pulses to input node 110 to communicate an impedance adjustment to environmental power generator 104. In particular, while power inverter 102 is receiving DC power from the environmental generator, signal source 111 can apply a signal to the DC power line, which signal is detectable at any point along the DC power line, including at the environmental power generator 104.

In response to the one or more signal pulses at input node 110, a controller within environmental power generator 104 can adjust variable impedance 132, improving the overall efficiency of the system 100. While variable impedance 132 is depicted as being in parallel with internal impedance 130 (which may be a fixed impedance), variable impedance 132 may be in series with internal impedance 130.

In an example, power inverter 102 is configured to detect the impedance of each of the environmental power generators to which it is coupled, including environmental power generators 104 and 106, and to selectively and independently adjust the variable impedances of the environmental power generators as needed. In contrast to impedance calibration processes that require all of the power and impedance measurements to be taken at each power generator and transmitted to a central inverter, power inverter 102 uses signal sources 111 and 128 to provide a remote measurement method to allow the measurements can be carried out at the central inverter (i.e., at the power inverter 102). Power inverter 102 uses the measured data to determine an impedance value of each of the environmental power generators and to selectively signal each of the environmental power generators to adjust their internal impedances to achieve a desired overall system power output. By adjusting the impedance, an impedance match can be achieved between the power inverter 102 and each environmental power generator 104 and 106 to provide a desired efficiency.

Figure 2:
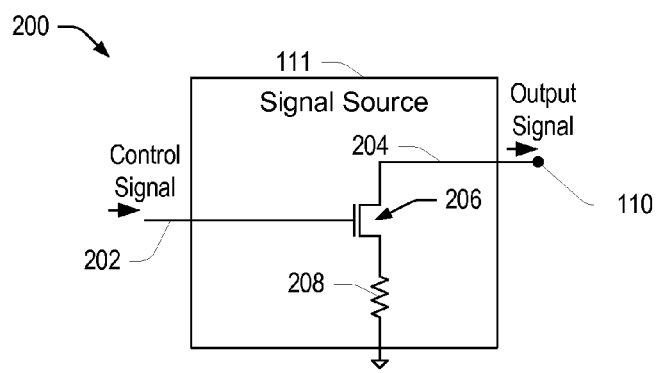
FIG. 2 is a block diagram of an embodiment of a method of controlling a switched impedance to determine the impedance of the power generator and to communicate an impedance adjustment to the power generator.

Detectors 116 and 126 and signals sources 111 and 128 make it possible to capture an impedance measurement on live power line and to communicate impedance adjustments and other information through the live power line. Signal sources 111 and 128 make both functions possible. In some instances, the signal sources 111 and 128 may be implemented as a switched impedance (or switchable resistance as shown in FIG. 2), which can be used both to capture the impedance measurement and to send impedance adjustments to the environmental power generators 104 and 106. One possible example of a signal source, such as signal sources 111 and 128 are described below with respect to FIG. 2.

FIG. 2 is a circuit diagram of an embodiment 200 of signal source 111, which can be used in the power inverter of FIG. 1, for providing an impedance adjustment. Signal source 111 includes a transistor 206 having a first current electrode 204 coupled to output node 110 for providing an output, a control terminal 202 for receiving a bias signal and/or a control signal from a controller (such as a digital signal processor (DSP) 108 in FIG. 1, a microcontroller unit, or other control circuit), and a second current electrode coupled to a first terminal of a resistor 208, which has a second terminal coupled to ground.

In this illustrated example, transistor 206 is a metal oxide semiconductor field effect transistor (MOSFET) coupled in series with a load resistor (resistor 208) to provide an extra load to the in-coming DC power supply at output node 110. When the transistor 206 is turned on for a short period of time (such as a few micro-seconds) by applying a control signal to control terminal 202, transistor 206 couples resistor 208 to output node 110, changing the input impedance. By measuring the voltage and/or current at output node 110 before and after the impedance is changed, the difference between the before and after measurements can be used by DSP 108 to determine the DC line impedance.

Further, DSP 108 can apply control signals to control terminal 202 for data communications as well. If transistor 208 is an n-channel MOSFET, each time a logic high signal is applied to control terminal 202, transistor 206 couples resistor 208 to output node 110, causing a dip or abrupt change in the DC power level at output node 110 and on the DC power line coupled to output node 110. This dip or abrupt change can be detected everywhere on the DC power line, including at the environmental power generator. Similarly, each time a logic low (or zero) signal is applied to control terminal 202, resistor 208 is disconnected from output node 110 and the DC power level returns to its steady state level. By selectively coupling resistor 208 to output node 110, a signal comprising ones and zeros can be transmitted through the live power carrying line to the environmental power generator 104. Such ones and zeros can be used to communicate impedance adjustments through the live power line to the environmental power generator 104. In an example, a controller, such as DSP 108, can modulate the control signal applied to control terminal 202 to control timing of transitions in the impedance adjustment signal applied to output node 110 to shape a power spectrum. In some instances, such power spectrum shaping may be utilized to reduce radiation of electromagnetic interference that might cause interference with nearby receivers.

The same detection and signaling technique may be used to detect DC power line impedances of each power line and to remotely control adjustable impedances of multiple environmental generators. For example, when used in conjunction with a solar array, power inverter 102 may detect a line impedance of each DC power line and selectively adjust impedances at each solar panel in the array. In particular, detector 110 measures an electrical parameter at output node 110. Controller 108 applies a control signal to control terminal 202 to allow current flow through transistor 206 (applying a first signal to output node 110). In response to application of the control signal, detector 116 measures the electrical parameter again. Controller 108 determines an impedance of a power line coupled to output node 110 based at least in part on the first and second measurements.

In some instances, controller 108 may determine the impedance based on a plurality of measurement of the electrical parameter captured over a period of time. In response to detecting the impedance, controller 108 can control transistor 206 to selectively couple resistor 208 to output node 110, communicating the measurement results from power inverter 102 to any environmental generator coupled by DC power line to output node 110. In particular, by applying pulses to control terminal 202, controller 108 causes transistor 206 to produce related changes to the electrical parameter at output node 110, which can be detected by any device coupled to the DC power lines. This provides a low-cost way to communicate impedance information and/or impedance adjustment signals to one or more attached environmental power generators, such as environmental power generator 104. A representative example of one possible embodiment of an environmental power generator is described below with respect to FIG. 3.

Figure 3:
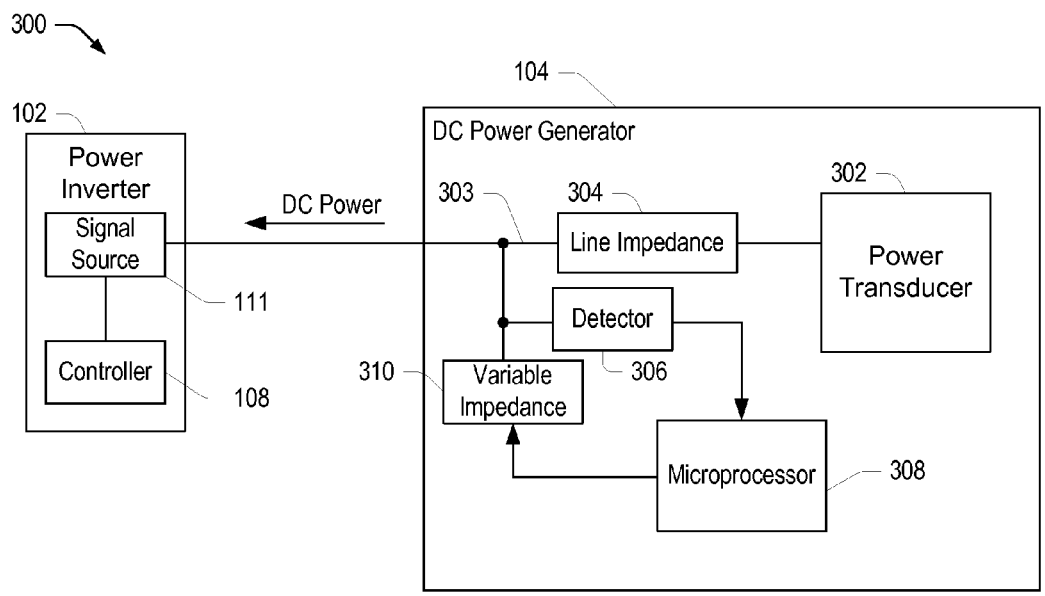
FIG. 3 is a block diagram of the system of FIG. 1 including an expanded view of an embodiment of the remote power generator.

FIG. 3 is a block diagram of a system 300 including an expanded view of an embodiment of the remote power generator 104 of FIG. 1. System 300 includes power inverter 102 coupled to environmental power generator 104 by a DC power line. Power inverter 102 includes controller 108, signal source 111 and other components described above with respect to FIGS. 1 and 2.

Environmental power generator 104 includes a power transducer 302, such as at least one solar panel, a wind turbine, a water turbine, or some other component that converts environmental or kinetic energy into electricity. Power transducer 302 includes an output coupled to a DC power line 303, which has a line impedance (represented by a block 304 labeled "Line Impedance"). Environmental power generator 104 further includes a detector 306 including an input coupled to the DC power line 303 and an output coupled to an input of a microprocessor 308. Microprocessor 308 includes an output coupled to an input of a variable impedance 310, which has an output coupled to DC power line 303. While variable impedance 310 is depicted as being in parallel with line impedance 304, in some embodiments, variable impedance 310 may include a variable resistance, a switchable resistive network, a variable capacitor, a switched capacitive network, other linear or non-linear impedances, or any combination thereof.

In an example, power transducer 302 produces DC power from environmental energy and provides the DC power to DC power line 303. As previously discussed, controller 108 within power inverter 102 determines a line impedance associated with DC power line 303 and environmental power generator 302 and controls signal source 111 to apply an impedance adjustment signal to DC power line 303. The impedance adjustment signal may include a sequence of logical ones and zeros or a sequence of pulses having modulated pulse widths.

Detector 306 within environmental power generator 104 detects the impedance adjustment signal and provides data related to the impedance adjustment signal to microprocessor 308. In response to the data, microprocessor 308 selectively controls variable impedance 310 to apply a desired impedance to DC power line 303. In a particular example, the variable impedance 310 can be adjusted periodically and/or as needed to enhance the efficiency of the DC power supply from environmental power generator 104.

In some instances, the impedance adjustment signal may be impedance measurement data, which can be used by microprocessor 308 to determine an adjustment for variable impedance 310. Alternatively, the impedance adjustment signal may include adjustment data, which can be applied by microprocessor 308 to adjust variable impedance 310.

Figure 4:
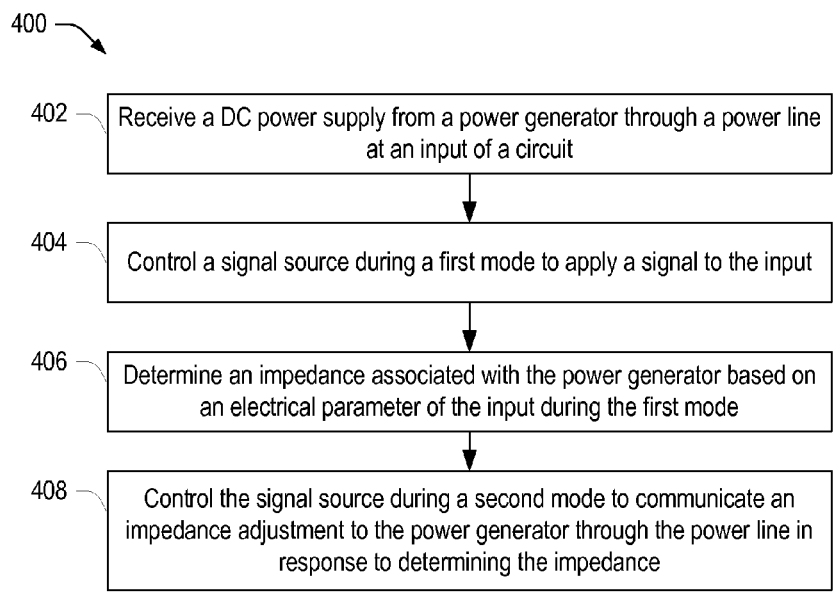
FIG. 4 is a flowchart of an embodiment of a method of producing a set of control parameters based on powers received from each power generators and their line impedance.

FIG. 4 is a flow diagram of an embodiment of a method 400 of providing an impedance adjustment. At 402, a DC power supply is received from a power generator through a power line coupled to an input of a circuit. In an example, the power generator can be an environmental power generator (such as a solar panel system, a windmill power system, a water-based power generator. Further, the circuit can be included within a power inverter of a power generation system having one or more power generators.

Advancing to 404, a controller of the circuit controls a signal source during a first mode to apply a signal to the input. The signal source can include a switched resistance that can be selectively coupled to the input to adjust the effective line impedance. Alternatively, the signal source can be a line driver or other circuit configured to apply a time-varying signal to the input. Continuing to 406, the controller determines an impedance associated with the power generator based on an electrical parameter of the input during the first mode. In an example, the controller measures an electrical parameter before and during the first mode and the impedance is determined as a function of the change in the electrical parameter before and during application of the signal to the input.

Proceeding to 408, the controller controls the signal source during a second mode to communicate an impedance adjustment to the power generator through the power line in response to determining the impedance. In an example, controller controls the signal source to apply one or more signals to the power line to communicate data, commands, instructions, or any combination thereof to a microprocessor of the power generator.

As previously discussed, by selectively altering an impedance at the input of the circuit, a value of the electrical parameter of the input is varied, which variation is detectable by any device coupled to the power line. Another example of a method of providing an impedance adjustment is described below with respect to FIG. 5.

Figure 5:
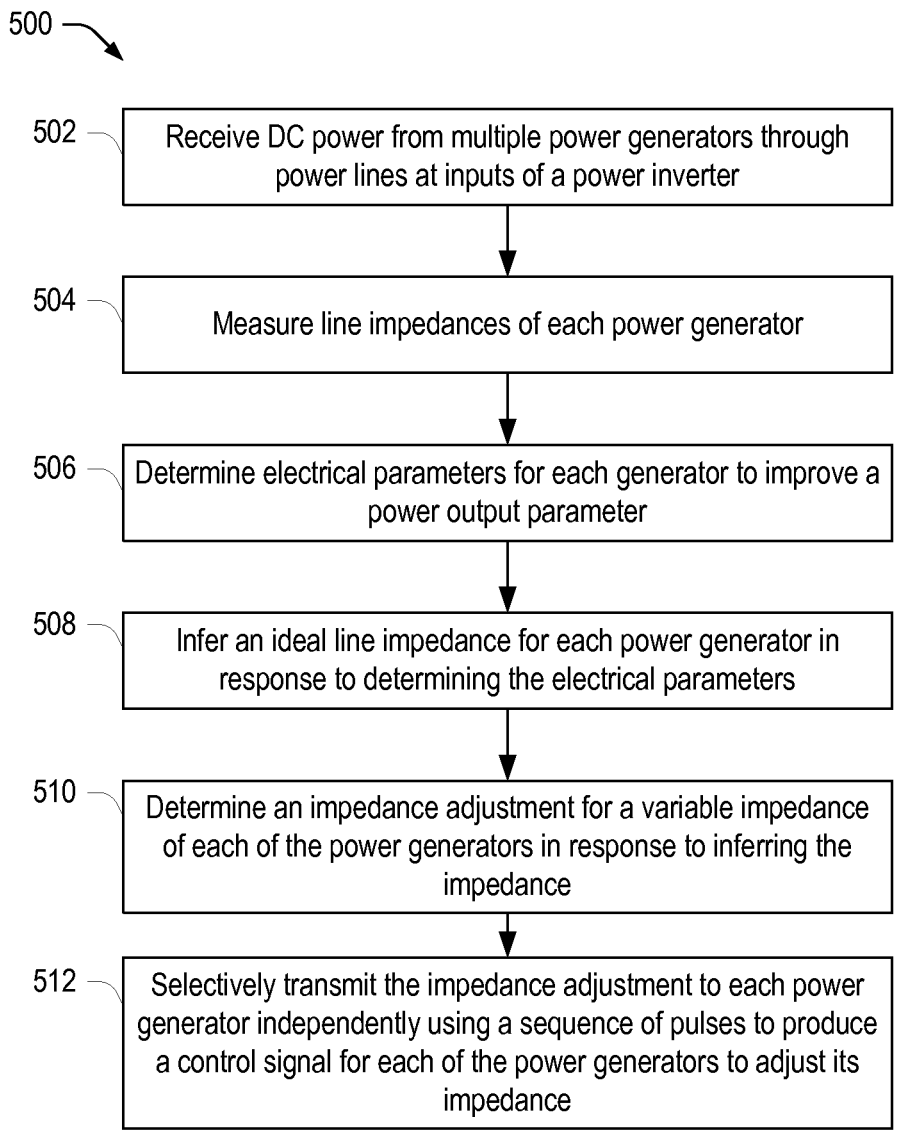
FIG. 5 is a flow diagram of an embodiment of a method of receiving a control signal at a power generator and applying an impedance adjustment according to the control signal.

FIG. 5 is a flow diagram of an embodiment of a method 500 of providing an impedance adjustment. At 502, DC power is received from multiple power generators through power lines at inputs of a circuit, such as a power inverter. Advancing to 504, line impedances of each power generator are measured. In an example, controller 108 controls signal sources, such as signals sources 111 and 128 to apply signals to nodes 110 and 120 (i.e., inputs coupled to power generators 104 and 106 in FIG. 1). Controller 108 then uses detectors 116 and 126 to detect the line impedances. In a particular example, controller 108 applies the signal by selectively activating a switch (such as transistor 206 in FIG. 2) to couple a resistor (such as resistor 208) to the input (node 110).

Proceeding to 506, the controller determines electrical parameters for each of the generators to improve a power output parameter. In an example, the electrical parameter is determined using a detector of the circuit. In one instance, the controller determines an optimal electrical parameter for each of the generators to achieve a maximum power output of the whole system. Moving to 508, the controller infers an ideal line impedance for each power generator in response to determining the electrical parameters. The ideal line impedance may be inferred from a change in the electrical parameter before and after application of the signal to the input. The controller may determine an impedance match based on the line impedance.

Continuing to 510, the controller determines an adjustment for a variable impedance of each power generator in response to inferring the impedances. Advancing to 512, the controller selectively transmits the impedance adjustment to each power generator independently using a sequence of pulses to produce a control signal for each of the power generators to adjust its impedance. In an example, if no adjustment is needed based on the impedance, the controller does not send an impedance adjustment signal to that particular power generator while sending impedance adjustment signals to other power generators. Further, each impedance adjustment can be unique relative to other impedance adjustments. In a particular example, the impedance adjustment signal transmitted to any of the power generators includes a sequence of pulses representing a control signal, which sequence is detectable by the power generator and which can be decoded by the power generator to determine and apply the adjustment to adjust the variable impedance at the power generator.

In an embodiment, prior to measuring the line impedance (block 504), the method 500 may include applying a signal to the input node, such as by selectively coupling a resistance to the input node via a transistor. In this instance, the controller infers the line impedance based on a change in the electrical parameter before and after coupling the resistance to the node. Further, in some instances, block 510 may be omitted, and the measurement data can be communicated by coupling the resistance to the input (selectively) to affect the DC voltage level on the input node, which changes in the DC voltage level can represent encoded signals for communicating the measurement data to the power generator. In an embodiment, the control signal may be pulse width modulated or may include a sequence of ones and zeros that provide sufficient data to adjust the impedance at the power generator.

While the methods 400 and 500 described above with respect to FIGS. 4 and 5 have provided examples of methods of providing an impedance adjustment, the signal applied to the node coupled to the DC power line is detectable at any point along the DC power line. An example of a method of adjusting a variable impedance of a power generator coupled to the DC power line in response to the signal applied to the DC power line is described below with respect to FIG. 6.

Figure 6:
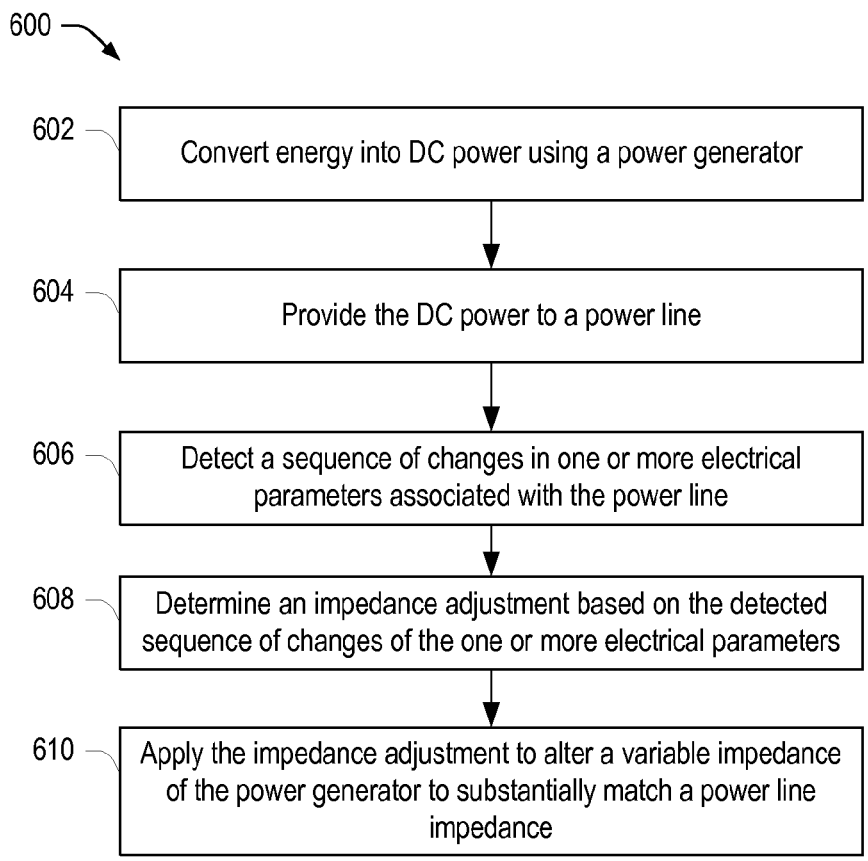
FIG. 6 is a flowchart of an embodiment of a method of receiving a control signal at a power generator and applying an impedance adjustment according to the control signal.

FIG. 6 is a flow diagram of an embodiment of a method 600 of receiving a control signal at a power generator and applying an impedance adjustment according to the control signal. At 602, a power generator converts environmental energy (or some other energy source) into DC power. Continuing to 604, the power generator provides the DC power to a power line. Advancing to 606, a microcontroller of the power generator detects a sequence of changes in one or more electrical parameters associated with the power line. In an example, the micro controller may receive a detection signal from a detector representing the electrical parameter. In a particular example, the sequence of changes can be a time-varying voltage, a sequence of pulses, a sequence of current changes, or another sequence of changes in the electrical parameter.

At 608, the microcontroller of the power generator determines an impedance adjustment in response to the detected sequence of changes in the one or more electrical parameters. In a particular example, the sequence of changes can include encoded data representing an impedance adjustment. Proceeding to 610, the microcontroller of the power generator applies the impedance adjustment to alter a variable impedance of the power generator according to the sequence of changes. In an example, the impedance adjustment alters the variable impedance to achieve an optimal power line impedance for the system to improve the overall power production.

In conjunction with the systems, methods and circuits described above with respect to FIGS. 1-6, a circuit is disclosed that includes an input terminal configurable to couple to a power line for receiving a power supply, a signal source coupled to the input terminal, a detector coupled to the input terminal, and a controller coupled to the signal source and to the detector. The controller controls the signal source to apply a first signal to the input terminal and receives measurement data from the detector. In response to the measurement data, the controller infers an impedance associated with the power line and controls the signal source to apply a second signal to the input terminal for communicating an impedance adjustment to a power generator coupled to the power line. In some instances, measurements may be captured before and after application of a signal. Alternatively, different signals may be applied and the measurements taken in response thereto.

Although the present invention has been described with reference to preferred embodiments, workers skilled in the art will recognize that changes may be made in form and detail without departing from the spirit and scope of the invention.

What is claimed is:

1. An apparatus comprising:
   a node configured to couple to a power line to receive direct current (DC) power from a power generator;
   a signal generator including a control input and including an output coupled to the node; and
   a control circuit including an input coupled to the output and including an control output coupled to the control input of the signal generator, the control circuit to determine an impedance associated with the power generator based on a signal at the input and to apply a control signal to the control input of the signal generator to produce an impedance adjustment signal on the output of the signal generator for communication to the power generator through the power line via the node in response determining the impedance.

2. The apparatus of claim 1, wherein the control signal controls the signal generator to produce a sequence of pulses to control a variable impedance of the power generator.

3. The apparatus of claim 2, wherein the control circuit modulates the control signal to control timing of transitions within the impedance adjustment signal to shape a power spectrum at the terminal.

4. The apparatus of claim 1, wherein the signal generator comprises:
   a transistor including a current electrode forming the output, the control terminal, and a second current electrode; and
   a resistor including a first terminal coupled to the second current electrode and a second terminal coupled to a power supply terminal.

5. The apparatus of claim 1, wherein the control circuit includes a plurality of control outputs coupled to a respective plurality of signal generators to provide impedance adjustment signals to a plurality of power generators through a respective plurality of terminals.

6. The apparatus of claim 1, wherein the control circuit is configured to:
   apply a first signal to the control terminal of the signal generator via the control output to alter an impedance at the terminal;
   detect a change in an electrical parameter of a signal on the terminal in response to applying the first signal;
   determine the impedance of the power generator in response to detecting the change; and
   generate the control signal based on the impedance of the power generator to produce the impedance adjustment signal.

7. The apparatus of claim 6, wherein the control signal includes a sequence of pulses that toggle the signal generator to produce the impedance adjustment signal.

8. A circuit for use in power control systems, the circuit comprising:
   a plurality of inputs configured to couple to a respective plurality of power generators through associated power lines;
   a plurality of signal generators, each of the plurality of signal generators including a control terminal and including a current electrode coupled to a respective one of the plurality of inputs;
   a plurality of detectors, each of the plurality of detectors including an input coupled to one of the plurality of inputs and an output; and
   a controller coupled to the output of each of the plurality of detectors and to the control terminal of each of the plurality of signal generators, the controller to receive a signal from one of the plurality of detectors indicating an electrical parameter associated with a selected one of the plurality of inputs, the controller to selectively control one of the plurality signal generators coupled to the selected one of the plurality of inputs to communicate an impedance adjustment signal to a power generator of the respective plurality of power generators coupled to the selected one of the plurality of inputs.

9. The circuit of claim 8, wherein each of the plurality of signal generators comprises a transistor including a first current electrode coupled to one of the plurality of inputs, a control terminal coupled to the controller; and a second current electrode resistively coupled to a power supply terminal.

10. The circuit of claim 8, wherein the controller is configured to:
   apply a bias signal to the control terminal of the one of the plurality of signal generators to alter an impedance at the selected one of the plurality of inputs;
   determine electrical parameters associated with the selected one of the plurality of inputs while receiving direct current (DC) power from the one of the power generator; and
   determine an impedance of the power generator in response to determining the electrical parameters.

11. The circuit of claim 10, wherein the controller selects the one of the plurality of signal generators to communicate the impedance adjustment signal to the power generator in response to inferring the impedance.

12. The circuit of claim 10, wherein the electrical parameters comprise a voltage level at the selected one of the plurality of inputs.

13. The circuit of claim 10, wherein the electrical parameters comprise a timing of a change in a voltage level at the selected one of the plurality of inputs.

14. The circuit of claim 8, wherein the controller controls the one of the plurality of signal generators to apply a sequence of pulses to the selected one of the plurality of inputs to communicate the impedance adjustment signal to the power generator.

15. The circuit of claim 14, wherein the controller controls timing of transitions within the sequence of pulses to shape a power spectrum of the impedance adjustment signal at the selected one of the plurality of inputs.

* * * * *